(12) United States Patent
Kondo et al.

(10) Patent No.: US 11,791,769 B2
(45) Date of Patent: Oct. 17, 2023

(54) DETECTION SYSTEM

(71) Applicant: TATSUMI RYOKI CO., LTD, Tokyo (JP)

(72) Inventors: Toyoshi Kondo, Tokyo (JP); Nobuhide Hamano, Tokyo (JP); Shigeo Masukawa, Chiba (JP)

(73) Assignee: TATSUMI RYOKI CO., LTD, Tokyo (JP)

( * ) Notice: Subject to any disclaimer, the term of this patent is extended or adjusted under 35 U.S.C. 154(b) by 492 days.

(21) Appl. No.: 17/115,289

(22) Filed: Dec. 8, 2020

(65) Prior Publication Data
US 2021/0091717 A1 Mar. 25, 2021

Related U.S. Application Data

(63) Continuation of application No. PCT/JP2019/027875, filed on Jul. 16, 2019.

(30) Foreign Application Priority Data

Aug. 17, 2018 (JP) ................................ 2018-153503

(51) Int. Cl.
*H04N 7/18* (2006.01)
*H02S 50/00* (2014.01)
(Continued)

(52) U.S. Cl.
CPC ............ *H02S 50/00* (2013.01); *G06T 7/0002* (2013.01); *H02S 40/32* (2014.12); *H02S 40/38* (2014.12);
(Continued)

(58) Field of Classification Search
None
See application file for complete search history.

(56) References Cited

U.S. PATENT DOCUMENTS

| 2014/0139664 | A1* | 5/2014 | Herzel ................... G06F 1/266 307/1 |
| 2017/0019570 | A1 | 1/2017 | Meller et al. |

(Continued)

FOREIGN PATENT DOCUMENTS

| CN | 107659266 A | 2/2018 |
| JP | 2004-130888 A | 4/2004 |

(Continued)

OTHER PUBLICATIONS

Extended European Search Report issued in European Patent Application No. 19849367.8, dated Apr. 5, 2022 (6 pages).

(Continued)

*Primary Examiner* — Eileen M Adams
(74) *Attorney, Agent, or Firm* — Nakanishi IP Associates, LLC

(57) ABSTRACT

To provide a detection system to identify a damage or a damaged part. A detection system includes a power generator, a power storage unit that receives first power supply from the power generator via cables, and detectors that perform at least one of outputting information and transmitting the information when it becomes in a state in which a weak current does not flow by a predetermined amount during a period when the weak current is passed to the power generator via at least part of the cables under a situation where the first power supply is not provided.

8 Claims, 9 Drawing Sheets

(51) Int. Cl.
*H02S 40/32* (2014.01)
*H02S 40/38* (2014.01)
*G06T 7/00* (2017.01)
*H04N 23/69* (2023.01)
*H02J 3/38* (2006.01)

(52) U.S. Cl.
CPC ............ *H04N 7/185* (2013.01); *H04N 23/69* (2023.01); *H02J 3/381* (2013.01); *H02J 2300/24* (2020.01)

(56) References Cited

U.S. PATENT DOCUMENTS

2018/0126560 A1*  5/2018  Yamamoto ............... B25J 5/007
2018/0198405 A1   7/2018  Watanabe et al.

FOREIGN PATENT DOCUMENTS

| JP | 2006-23105 A | 1/2006 |
| JP | 2015-188306 A | 10/2015 |
| JP | 2016-32379 A | 3/2016 |
| JP | 2016-52191 A | 4/2016 |
| JP | 2016-178769 A | 10/2016 |
| JP | 2017-34932 A | 2/2017 |
| JP | 2018-91650 A | 6/2018 |
| JP | 2018-129980 A | 8/2018 |
| WO | 2017/009892 A1 | 1/2017 |

OTHER PUBLICATIONS

International Search Report issued in PCT/JP2019/027875 dated Sep. 3, 2019 with English Translation (5 pages).

\* cited by examiner

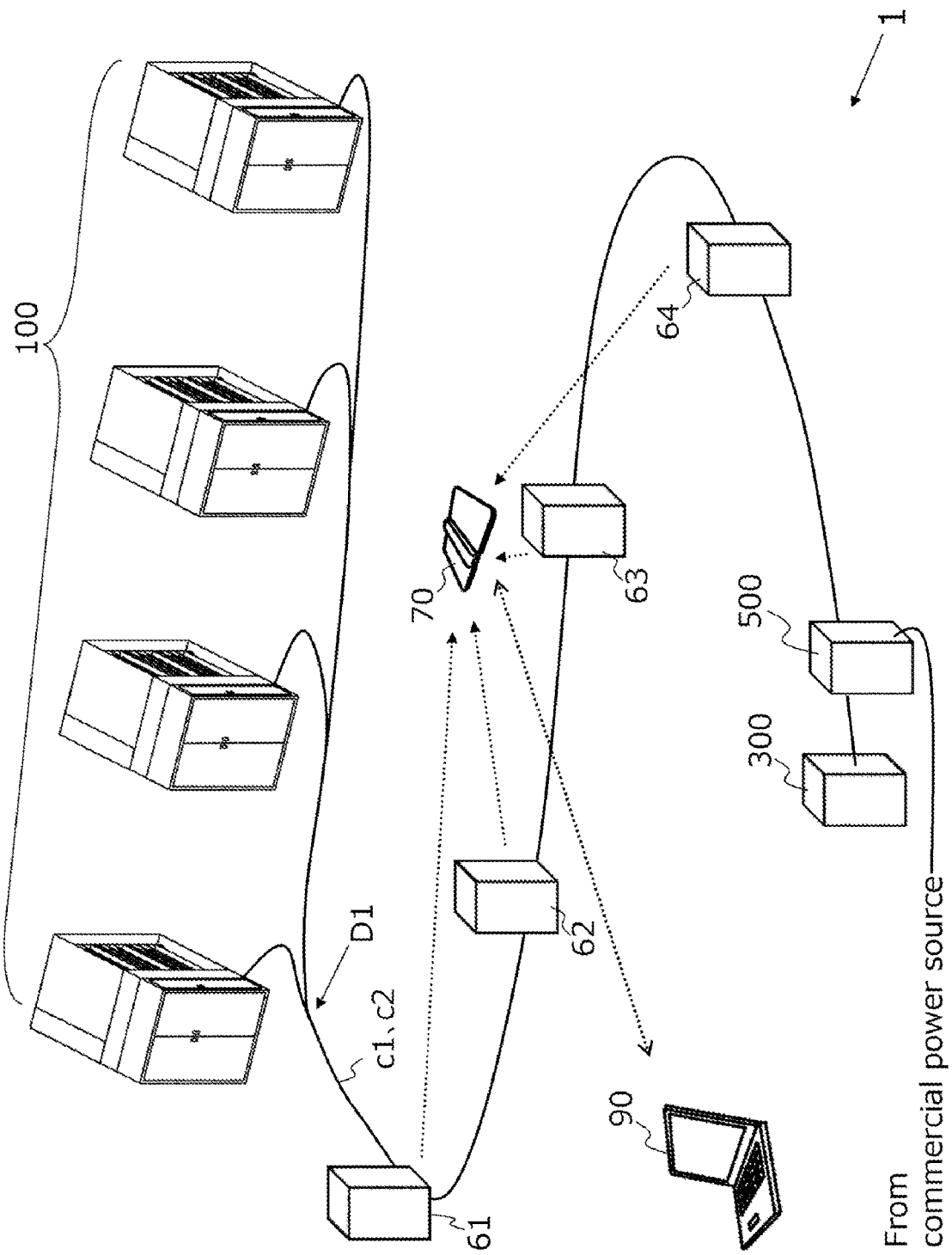

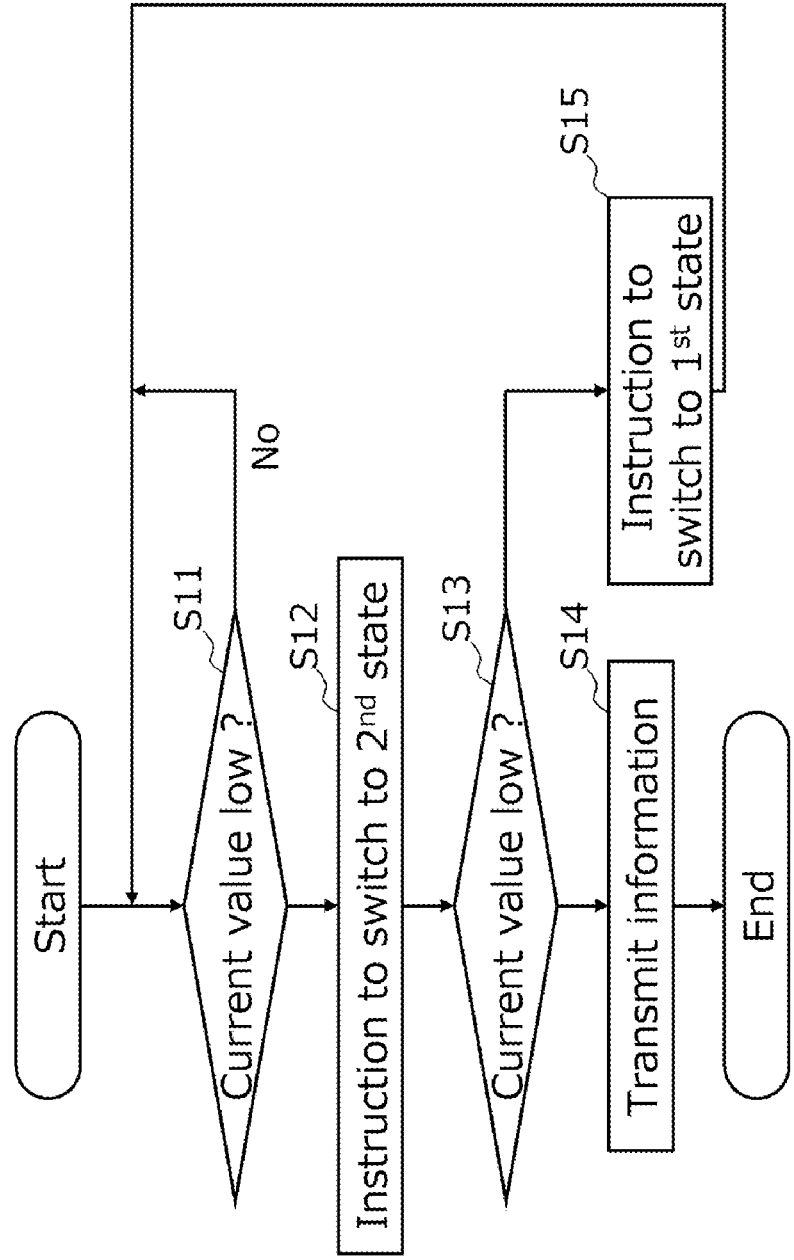

DETECTION SYSTEM

CROSS-REFERENCE TO RELATED APPLICATIONS

This application is a continuation application of International Patent Application No. PCT/JP2019/027875 filed on Jul. 16, 2019, which claims priority to Japanese Patent Application No. 2018-153503 filed on Aug. 17, 2018, the entire contents of which are incorporated by reference.

TECHNICAL FIELD

The present invention relates to a detection system.

BACKGROUND ART

Conventionally, as in Patent Literature 1, a power generation device including a solar panel is proposed.

CITATION LIST

Patent Literature

Patent Literature 1: JP 2004-130888 A

However, there is a problem that solar panels and cables are damaged due to theft.

SUMMARY OF INVENTION

One or more embodiments of the present invention are directed to a detection system for identifying a damage or a damaged location.

A detection system according to one or more embodiments of the present invention includes a first device, a second device that receives first power supply from the first device or provide second power supply to the first device via a cable, and a detector that performs at least one of outputting information and transmitting the information when it becomes in a state in which a weak current does not flow by a predetermined amount, in a period in which the weak current is passed to the first device through at least a part of the cable, under a situation where the first power supply and the second power supply are not provided.

This makes it possible to identify the occurrence of an abnormality and the location where the abnormality has occurred even at an early stage, even if disconnection of the cable occurs when normal power supply is not performed.

Preferably, the first device is a power generator including a solar panel. The second device is at least one of a power storage unit that stores electric power obtained by the power generator and an inverter that converts the electric power obtained by the power generator into an alternating current, and the second device receives the first power supply.

This makes it possible to identify the occurrence of an abnormality and the location where the abnormality has occurred at an early stage, even if disconnection of the cable occurs, when a power generator 10 does not generate power (when normal power supply is not performed by the power generator 10).

More preferably, weak electric power supplied to the first device is supplied from the second device via a first circuit unit when the first device does not generate power. The first circuit unit controls electric power supplied from the second device to the first device via the first circuit unit such that the weak current, in which electric power per unit time required to supply from the second device to the first device via the first circuit unit is $1/100$ or less of electric power per unit time that can be generated by the first device, flows to the cable.

Further preferably, the first device is a load test device. The second device is a test target power source corresponding to the load test device for performing the second power supply. The weak electric power supplied to the first device is supplied from a commercial power source via a second circuit unit when a load test of the test target power source is not performed. The second circuit unit controls electric power supplied from the commercial power source to the first device via the second circuit unit, such that the weak current, in which electric power per unit time required to supply from the commercial power source to the first device via the second circuit unit is $1/100$ or less of electric power per unit time supplied from the second device to the first device during a load test, flows through the cable.

This makes it possible to identify the occurrence of an abnormality and the location where the abnormality has occurred at an early stage, even if disconnection of the cable occurs, when a load test is not performed (when normal power supply to a load test device 100 is not performed).

More preferably, a moving device is further provided, which moves between the first device and the second device to photograph at least one of the first device, the second device, and the cable.

Thus, by moving the moving device and photographing the moved location, it is possible to identify an abnormality occurrence location at an early stage.

More preferably, a plurality of the detectors is provided between the first device and the second device. When the information is transmitted, the moving device moves to a vicinity of the detector that has transmitted the information first among the plurality of detectors to perform the photographing.

By the detectors provided at multiple locations, when the current (or voltage) decreases, an abnormality can be detected.

In addition, by moving the moving device to the vicinity of the detector that has detected the abnormality first and photographing said vicinity, it becomes possible to identify the abnormality occurrence location at an early stage.

More preferably, an information output device that receives image data obtained by photographing from the moving device is further provided. When the information is transmitted, the information output device displays a first image obtained by photographing in a vicinity of the detector that has transmitted the information first among the plurality of detectors, a second image of past of a place where the photographing has been performed, and information regarding a comparison result of the first image and the second image.

By moving the moving device to the vicinity of the detector that has detected the abnormality first, photographing said vicinity, and comparing the current image (first image p1) with the past image (second image p2), it becomes possible to identify the abnormality occurrence location at an early stage.

Further preferably, the information output device that receives image data obtained by photographing from the moving device is further provided. When information is transmitted, the information output device displays a first image obtained by photographing in a vicinity of the detector that has transmitted the information first among the plurality of detectors, and the third image obtained by photographing at a wider angle of view than the first image.

By moving the moving device to the vicinity of the detector that has detected the abnormality first, photographing the vicinity, and capturing an image (third image p3) around the abnormality occurrence location, the possibility of obtaining information regarding the cause of disconnection (people, animals, objects, etc.) increases.

Further, preferably, the weak current is passed to the first device, when it becomes in a state in which a current passed to the first device does not flow by the predetermined amount under a situation where either the first power supply or the second power supply is provided. Furthermore, the detector performs at least one of outputting the information and transmitting the information, when it becomes in a state in which the weak current does not flow by the predetermined amount.

As a result, accurate abnormality detection can be performed without determining the temporary decrease in a current value (or voltage drop) during normal operation as abnormal.

The detection system according to one or more embodiments of the present invention includes a first device, a second device that receives first power supply from the first device or provides second power supply to the first device in a cable, a detector that performs at least one of outputting information and transmitting the information when it becomes in a state in which a current is not passed to the first device by a predetermined amount, and a moving device that moves between the first device and the second device to photograph at least one of the first device, the second device, and the cable. A plurality of the detectors is provided between the first device and the second device. When the information is transmitted, the moving device moves to a vicinity of the detector that has transmitted the information first among the plurality of detectors to perform the photographing.

By the detectors provided at multiple locations, when the current (or voltage) decreases, an abnormality can be detected.

In addition, by moving the moving device to the vicinity of the detector that has detected the abnormality first and photographing the vicinity, it becomes possible to identify the abnormality occurrence location at an early stage.

Advantageous Effects of Invention

As described above, according to one or more embodiments of the present invention, it is possible to provide a detection system that identifies a damage or a damaged location.

BRIEF DESCRIPTION OF DRAWINGS

FIG. 8 is a perspective view of a configuration of a detection system according to a second embodiment.

FIG. 9 is a flowchart illustrating a procedure for transmitting information from a first communication unit to a moving device.

DESCRIPTION OF EMBODIMENTS

Figure 1:
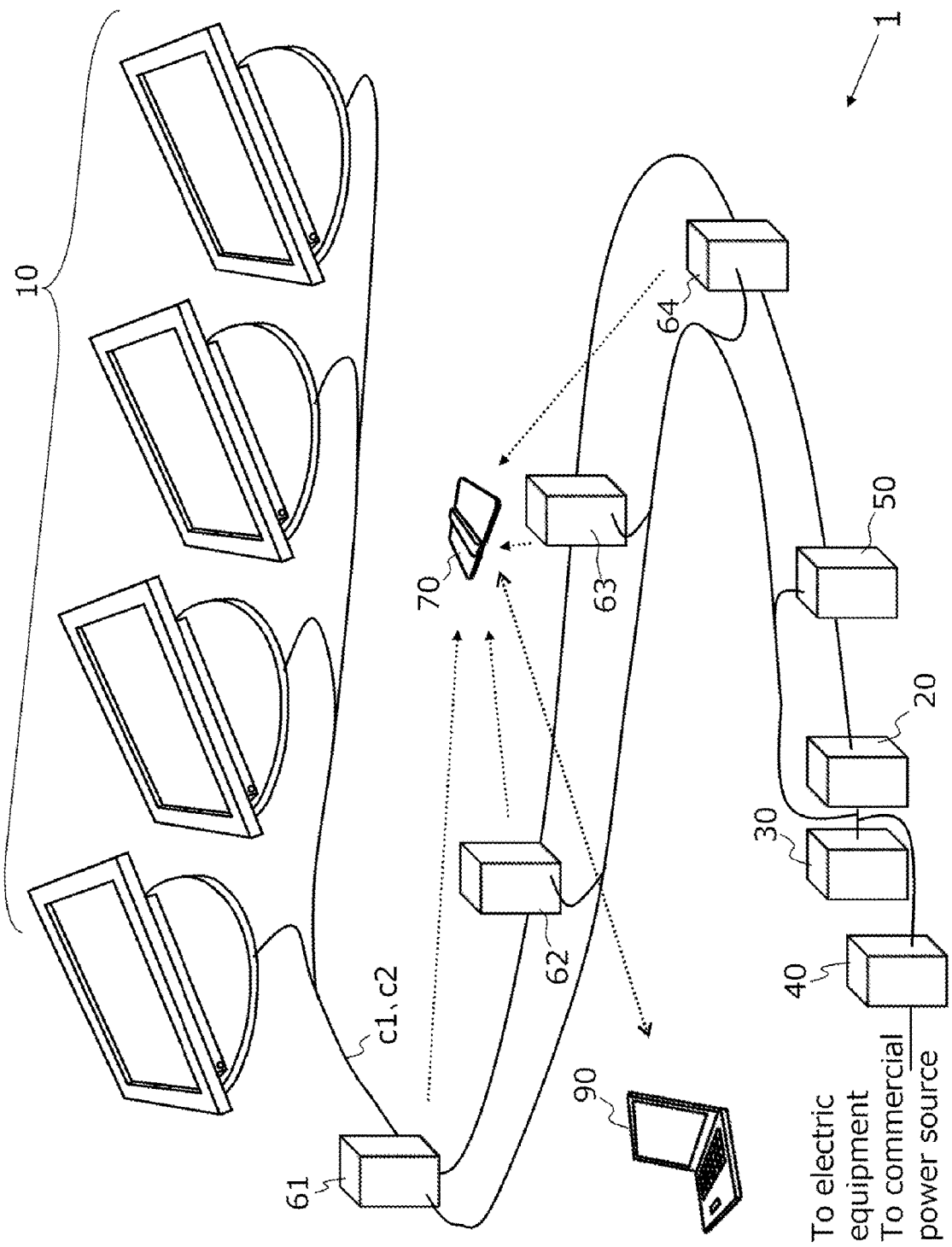
FIG. 1 is a perspective view illustrating a configuration of a detection system in a first embodiment.
Figure 2:
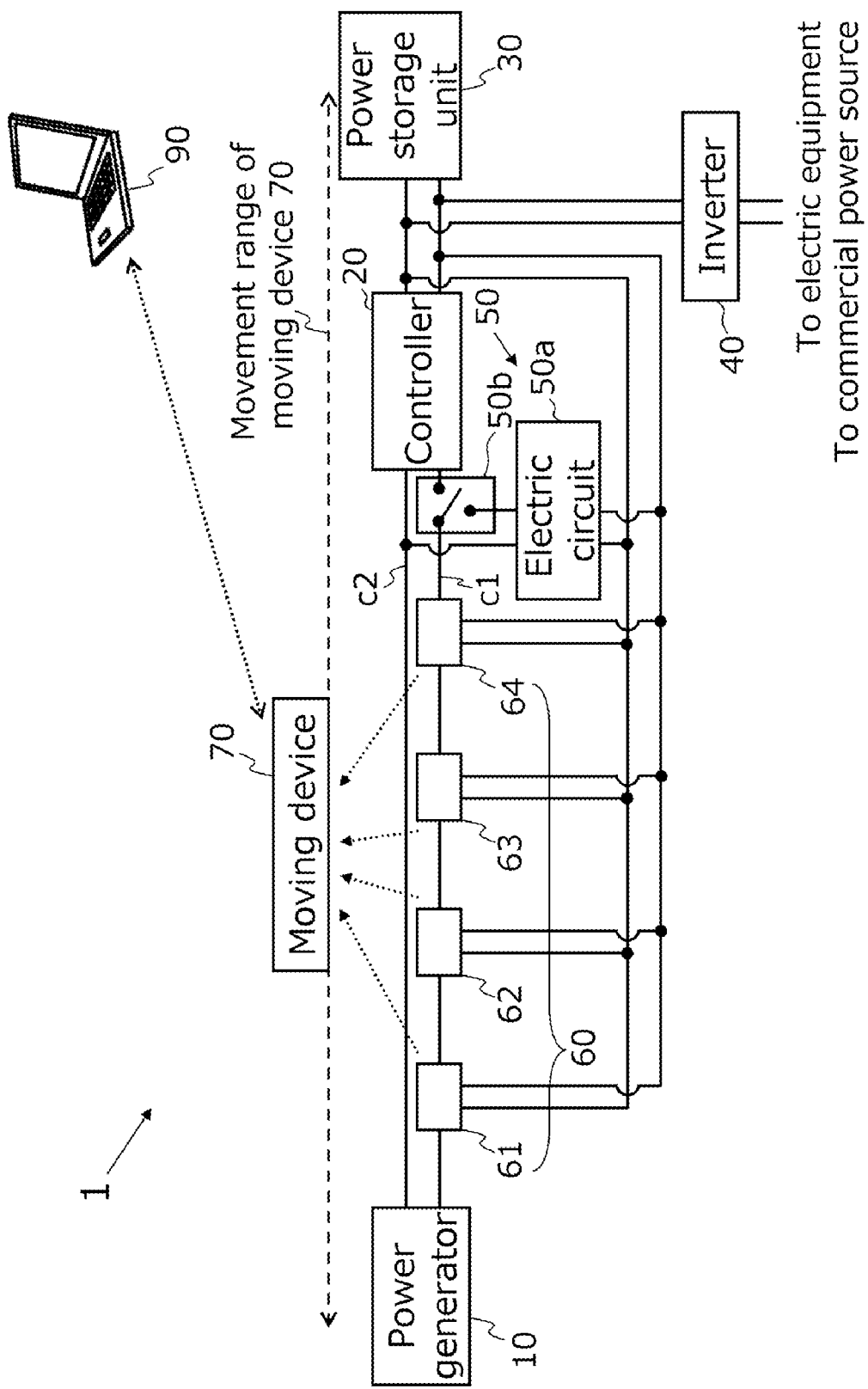
FIG. 2 is a schematic diagram illustrating a configuration of the detection system in the first embodiment.

A first embodiment described herein will be described below with reference to drawings.

Note that the embodiments are not limited to the following embodiments. Further, the content described in one embodiment is similarly applied to other embodiments in principle. In addition, each embodiment and each modification can be appropriately combined.

A detection system 1 according to the first embodiment includes a power generator 10, a charge controller 20, a power storage unit 30, an inverter 40, a first circuit unit 50, a detector 60, a moving device 70, and an information output device 90 (refer to FIGS. 1 to 7).

In the first embodiment, the power generator 10 corresponds to the first device in the claims, at least one of the power storage unit 30 and the inverter 40 corresponds to the second device in the claims, and the power supply for charging from the power generator 10 to the power storage unit 30 via the charge controller 20 corresponds to the first power supply in the claims.

The power generator 10 is a power generation device that includes a solar panel and converts light energy such as sunlight into electric energy.

The power generator 10 is connected to the charge controller 20 via a first cable c1 and a second cable c2.

The electric power obtained by the power generator 10 is used for such as charging the power storage unit 30, charging power storage devices (first power storage device etc.) provided in each of the detectors 60, driving electrical equipment provided in the subsequent stage of the inverter 40, and supplying electric power to a commercial power source (power sales).

The first embodiment shows an example in which the power generator 10 includes four solar panels, but the number of solar panels is not limited thereto.

The charge controller 20 is a charge/discharge controller that monitors the voltage of the power storage unit 30 and prevents overcharge from the power generator 10 to the power storage unit 30.

Note that, instead of the charge controller 20, a blocking diode that prevents a backflow phenomenon in which a current flows from the power storage unit 30 to the power generator 10 may be provided.

The power storage unit 30 stores the electric power obtained in the power generator 10.

The inverter 40 converts the electric power obtained in the power generator 10 or the electric power stored in the power storage unit 30 into alternating current, and supplies the electric power to the commercial power source in the subsequent stage and AC-driven electric equipment.

Note that, instead of the inverter 40, a distributor may be provided which distributes the electric power obtained by the power generator 10 or the electric power stored in the power storage unit 30 and supply the electric power to a plurality of DC-driven electric products.

The first circuit unit 50 has an electric circuit 50*a* and a switch 50*b*.

The electric circuit 50a supplies a weak current to the first cable c1 and the second cable c2 based on the electric power stored in the power storage unit 30.

The switch 50b switches the member connected to the power generator 10 between the charge controller 20 and the electric circuit 50a.

The switch 50b is switch-controlled such that the power generator 10 and the charge controller 20 are electrically connected to each other in a first state, the electric power obtained by the power generator 10 is supplied to the charge controller 20, and power supply from the power storage unit 30 to the power generator 10 via the electric circuit 50a is stopped.

The switch 50b is switch-controlled such that the power generator 10 and the electric circuit 50a are electrically connected in a second state, the electric power stored in the power storage unit 30 is supplied to the power generator 10 via the electric circuit 50a, and the power supply from the power generator 10 to the charge controller 20 is stopped.

The switch 50b is set to the first state during the time period when the power generator 10 can generate power, and is set to the second state during the time period when the power generator 10 cannot generate power.

Specifically, the switches of the first circuit unit 50 are controlled such that a preset first time zone (for example, from 6:00 am to 6:00 pm) is set in the first state, and a preset second time zone (for example, from 6:00 pm to 6:00 am on the next day) is set in the second state.

The electric circuit 50a controls the electric power supplied from the power storage unit 30 to the power generator 10 via the electric circuit 50a such that a weak current, in which the electric power per unit time required to supply from the power storage unit 30 to the power generator 10 via the electric circuit 50a in the second time zone is $1/100$ or less of electric power per unit time that can be generated by the power generator 10 in the first time zone, flows to the first cable c1 and the like.

Further, it is desirable that the electric circuit 50a control the electric power supplied from the power storage unit 30 to the power generator 10 via the electric circuit 50a, such that, during the second time zone, the electric power per unit time required when the power storage unit 30 supplies power to the power generator 10 via the electric circuit 50a is larger than the power output from the power generator 10 when the normal power generator 10 can hardly generate power at night.

The switch control of the switch 50b may be performed by the electric circuit 50a of the first circuit unit 50 or may be performed by an external control device.

The first time zone and the second time zone may be fixed, or may be varied according to the sunshine hours that vary depending on the month and day and the area.

For example, in the Northern Hemisphere, it is conceivable that the first time zone is lengthened during the long sunshine hours in summer, and the first time zone is shortened during the short sunshine hours in winter.

In addition, a sensor that detects the illuminance of sunlight is provided, and switching of the switch 50b may be controlled such that when the illuminance is lower than a threshold value, it is determined that power cannot be generated, and the switch is set in the second state, and when the illuminance is higher than the threshold value, it is determined that power can be generated, and the switch is set in the first state.

While the power generator 10 is generating power, a current flows through the first cable c1 and the second cable c2 based on the electric power obtained in the power generator 10. That is, charging from the power generator 10 to the power storage unit 30 via the charge controller 20 is performed.

During this time, the switch 50b of the first circuit unit 50 is in the first state, and no voltage is applied from the power storage unit 30 to the power generator 10 via the electric circuit 50a.

While the power generator 10 is not generating power, a current flows through (at least a part of) the first cable c1 and the second cable c2 based on the power accumulated in the power storage unit 30. That is, a voltage is applied from the power storage unit 30 to the power generator 10 via the electric circuit 50a.

However, the current flowing through the power generator 10 is very small, and the power generator 10 does not output anything due to the flow of the current.

In addition, the electric power stored in the power storage unit 30 does not decrease significantly.

Note that the voltage application to the power generator 10 via the electric circuit 50a is not limited to that by the power storage unit 30, and may be from another power source.

The detector 60 has a first detector 61 to a fourth detector 64.

The first detector 61 to the fourth detector 64 are provided on the cable (at least one of the first cable c1 and the second cable c2) between the power generator 10 and the charge controller 20, and detect at least one of the current flowing through said cable and the voltage applied to the power generator 10 or the charge controller 20, during the second time period, that is, when the power generator 10 is not generating power.

In the first embodiment, the first detector 61 to the fourth detector 64 will be described as being provided on the first cable c1 and detecting the current flowing through the first cable c1.

The first detector 61 is provided on the first cable c1 and at a position close to the power generator 10.

The fourth detector 64 is provided on the first cable c1 and at a position close to the charge controller 20.

The second detector 62 is provided on the first cable c1 where is the position where the first detector 61 is sandwiched with the power generator 10, and the position where the third detector 63 and the fourth detector 64 are sandwiched with the charge controller 20.

The third detector 63 is provided on the first cable c1 where is the position where the first detector 61 and the second detector 62 are sandwiched with the power generator 10, and the position where the fourth detector 64 is sandwiched with the charge controller 20.

Figure 3:
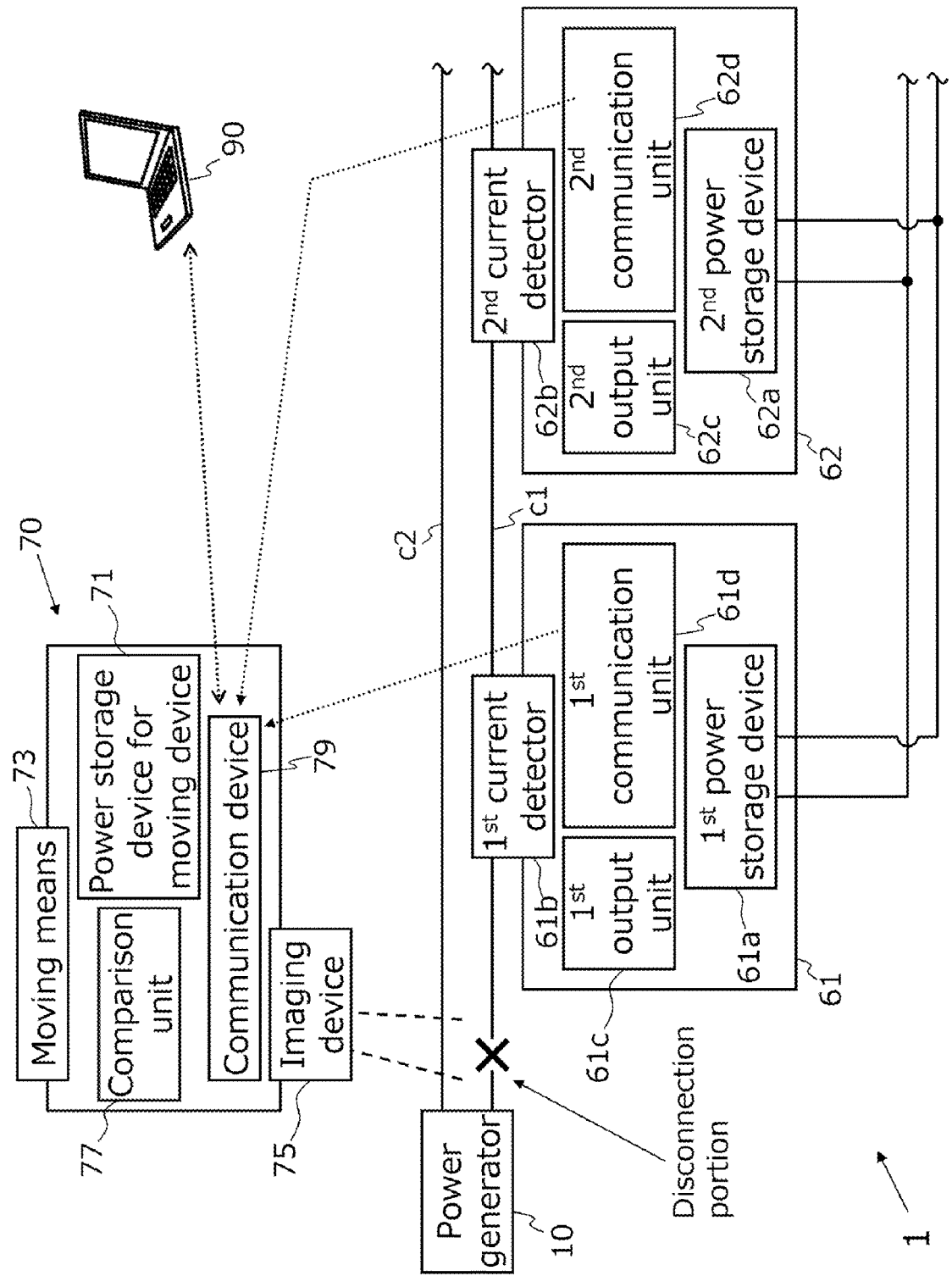
FIG. 3 is a schematic diagram illustrating a configuration of a region including a first detector of the detection system according to the first embodiment.

The first detector 61 has a first power storage device 61a, a first current detector 61b, a first output unit 61c, and a first communication unit 61d (refer to FIG. 3).

The first power storage device 61a stores the electric power supplied from the power storage unit 30.

The power stored in the first power storage device 61a is not limited to that from the power storage unit 30, and may be another power, for example, from a commercial power source.

The electric power stored in the first power storage device 61a is used to drive the first current detector 61b, the first output unit 61c, and the first communication unit 61d.

By using the first power storage device 61a, even if there is a disconnection between the first detector 61 and the power storage unit 30, the detection by the first detector 61 can be continued.

Note that, it is also possible to directly drive the first current detector 61b and the like with the electric power from the power storage unit 30 without providing the first power storage device 61a.

The first current detector 61b detects the value of the current flowing in the region of the first cable c1 where the first detector 61 is disposed.

The first current detector 61b may measure the current value with directly connecting the first cable c1 or may measure the current value without connecting the first cable c1.

In the first output unit 61c, when a weak current does not flow by a predetermined amount and the current value detected by the first current detector 61b is equal to or less than the current threshold value, it is determined that there is an abnormality, and any of voice, light, and image is output as the output of information regarding the abnormality.

For example, the first output unit 61c has a lighting device such as an LED and turns on said lighting device when the current value detected by the first current detector 61b is equal to or less than the current threshold value.

The first communication unit 61d transmits information about the current value detected by the first current detector 61b to the moving device 70.

In addition, in the first communication unit 61d, when a weak current does not flow by the predetermined amount and the current value detected by the first current detector 61b is equal to or less than the current threshold value, information regarding a fact that the current value detected by the first current detector 61b is equal to or less than the current threshold value is transmitted to the moving device 70 as the transmission of information relating to the abnormality.

Note that the information regarding the current value detected by the first current detector 61b, the information regarding the abnormality, and the like may be transmitted to not only the moving device 70 but also the information output device 90.

Similar to the first detector 61, the second detector 62 has a second power storage device 62a, a second current detector 62b, a second output unit 62c, and a second communication unit 62d (refer to FIG. 3).

Similar to the first detector 61 and the second detector 62, the third detector 63 has a third power storage device 63a, a third current detector 63b, a third output unit 63c, and a third communication unit 63d (not illustrated).

Similar to the first detector 61, the second detector 62, and the third detector 63, the fourth detector 64, has a fourth power storage device 64a, a fourth current detector 64b, a fourth output unit 64c, and a fourth communication unit 64d (not illustrated).

The moving device 70 includes a power storage device 71 for moving device, a moving means 73, an imaging device 75, a comparison unit 77, and a communication device 79.

The power storage device 71 for moving device is used to supply electric power to each unit of the moving device 70.

Power storage in the power storage device 71 for moving device is performed in a state where the moving device 70 is moved to a position near a power source such as the power storage unit 30.

The power stored in the power storage device 71 for moving device is not limited to that from the power storage unit 30, and may be another power, for example, from a commercial power source.

The moving means 73 is a device for moving the moving device 70 between the power generator 10 and the power storage unit 30 along the area where the cables (the first cable c1 and the second cable c2) are located.

The moving means 73 may be, for example, a walking device used in a walking robot, a rotary moving device used in a vehicle, an airborne floating device used in a drone, or the like.

In the first embodiment, the moving means 73 will be described as an airborne floating device.

In a normal time before an abnormality occurs, the moving means 73 moves between the power generator 10 and the power storage unit 30 along the area where the cables exist at regular time intervals (for example, every one hour), and the imaging device 75 performs photographing (first photographing).

Specifically, as said first photographing, the imaging device 75 acquires image data of the power generator 10, the charge controller 20, the power storage unit 30, portions where the first to fourth detectors 61 to 64 are located, the cable between the power generator 10 and the first detector 61, a cable between the first detector 61 and the second detector 62, a cable between the second detector 62 and the third detector 63, a cable between the third detector 63 and the fourth detector 64, a cable between the fourth detector 64 and the charge controller 20, a cable between the charge controller 20 and the power storage unit 30, and the like.

If an abnormality occurs, the moving means 73 moves to one of the first output unit 61c to the fourth output unit 64c that has performed output first, and the imaging device 75 performs photographing (second photographing).

Specifically, as said second photographing, the imaging device 75 acquires image data of one of the power generator 10 and the detector 60 near the output unit that has performed output first among the first output unit 61c to the fourth output unit 64c, or the charge controller 20, cables, and the like.

Then, after moving to a place where the power generator 10 locates, the imaging device 75 performs photographing (third photographing).

Specifically, the imaging device 75 acquires image data of the power generator 10 and the cables in the vicinity of the power generator 10 as said third photographing.

Then, after moving between the power generator 10 and the power storage unit 30, the imaging device 75 performs photographing as in normal times (the first photographing).

The imaging device 75 photographs the location where the moving device 70 in the first cable c1 and the second cable c2 has approached The photographing is performed not only in a time when an abnormality occurs but also in a normal time before the abnormality occurs.

The imaging device 75 acquires the information regarding the photographing place together with the image data at the time of photographing.

The moving device 70 presets a place for performing the first to third photographing between the power generator 10 and the power storage unit 30, and the moving means 73 moves to said preset place, and the imaging device 75 captures images (first to third photographing) at said place.

The comparison unit 77 compares the images obtained by the imaging device 75, which are taken at the same place, and determines whether or not said photographing portion is an abnormal location based on the comparison result.

Specifically, the comparison unit 77 compares the latest image (first image p1) and the image about one day ago (for example, 24 hours ago) (second image p2) which are taken with the imaging device 75 and taken at the same place, and when the comparison unit 77 determines that the degree of change is large, it is determined that said photographing place is an abnormal location.

More specifically, the comparison unit 77 compares the brightness value of the first image p1 (the average value or the total value of the brightness of each pixel) and the brightness value of the second image p2 (the average value or the total value of the brightness of each pixel), and if the absolute value of the difference is smaller than the brightness threshold, the comparison unit 77 determines that the degree of change is small, and if the absolute value of the difference is equal to or higher than the brightness threshold, the comparison unit 77 determines that the degree of change is large.

Note that the imaging device 75 may be a visible light camera or an infrared camera.

When the imaging device 75 is an infrared camera, the first image p1 and the second image p2 are compared using an infrared image or an infrared thermal image obtained by converting the amount of infrared energy into temperature.

In this case, by visualizing the temperature change of a subject that is difficult to capture with a visible light camera, an abnormal location can be visually recognized.

Note that the determination whether there is an abnormality performed by the comparison unit 77 may be performed by the moving device 70 or by the information output device 90.

If the comparison unit 77 determines that the location is abnormal, for the photographing place determined to be said abnormal location, the imaging device 75 photographs not only the cable but also the surroundings to acquire an image of said surroundings (third image p3).

That is, the third image p3 is an image obtained by photographing with a wider angle of view than the first image p1.

The third image p3 is not limited to the image including the cable determined to be the abnormal location, and may be the image of the area not including said cable at the photographing place determined to be said abnormal location.

Note that not only at the time of abnormality, but also at the time of normal time, the comparison unit 77 may compare the first image p1 and the second image p2 to determine whether or not said photographing place is an abnormal location.

In this case, even before the disconnection of the cable, that is, before the detector 60 detects an abnormality, the situation that a suspicious person is approaching the cable can be determined as an abnormal location by photographing.

The communication device 79 communicates with the detector 60 and the information output device 90.

In normal time before an abnormality occurs, the communication device 79 transmits the image data taken with the imaging device 75 to the information output device 90.

Said image data is used as a comparative image (second image p2) when an abnormality occurs.

When an abnormality occurs, the communication device 79 transmits to the information output device 90 the image data regarding the first image p1, the second image p2, and the third image p3 which are taken at a place where it is determined by the comparison unit 77 that an abnormality has occurred and said image data.

The information output device 90 is a personal computer of an administrator or the like and is provided at a place away from the place where the power generator 10 and the power storage unit 30 are provided.

Figure 4:
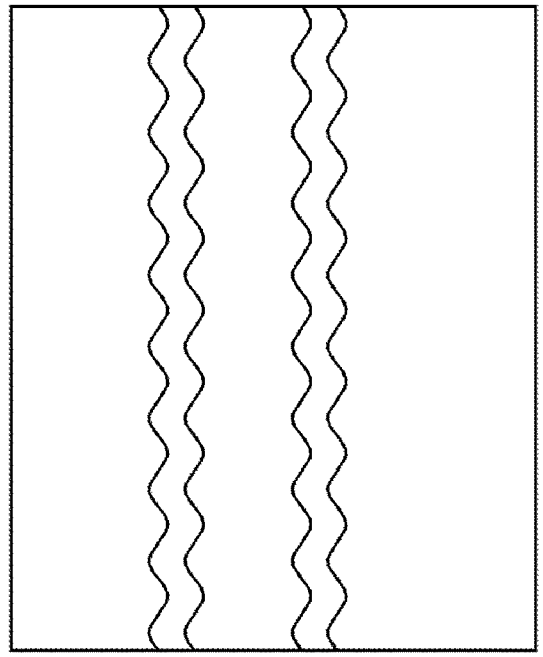
FIG. 4 is an example of a screen displayed on an information output device in a normal time.

In the normal time before an abnormality occurs, the information output device 90 displays an image corresponding to the image data received from the communication device 79 (refer to FIG. 4).

At this time, the information output device 90 displays an image corresponding to the image data, and information regarding the date/time (photographing date/time), the photographing place, and the presence/absence of an abnormality (status), corresponding to the image data.

FIG. 4 shows an example that, as an image corresponding to the image data, an image in which the first cable c1 and the second cable c2 at the photographing place are not disconnected is displayed, and as the information regarding the photographing date and time, a state where the photographing date and time is at 20:10 on Aug. 8, 2018, the photographing place is near the first detector 61, and the status is normal is displayed.

Figure 5:
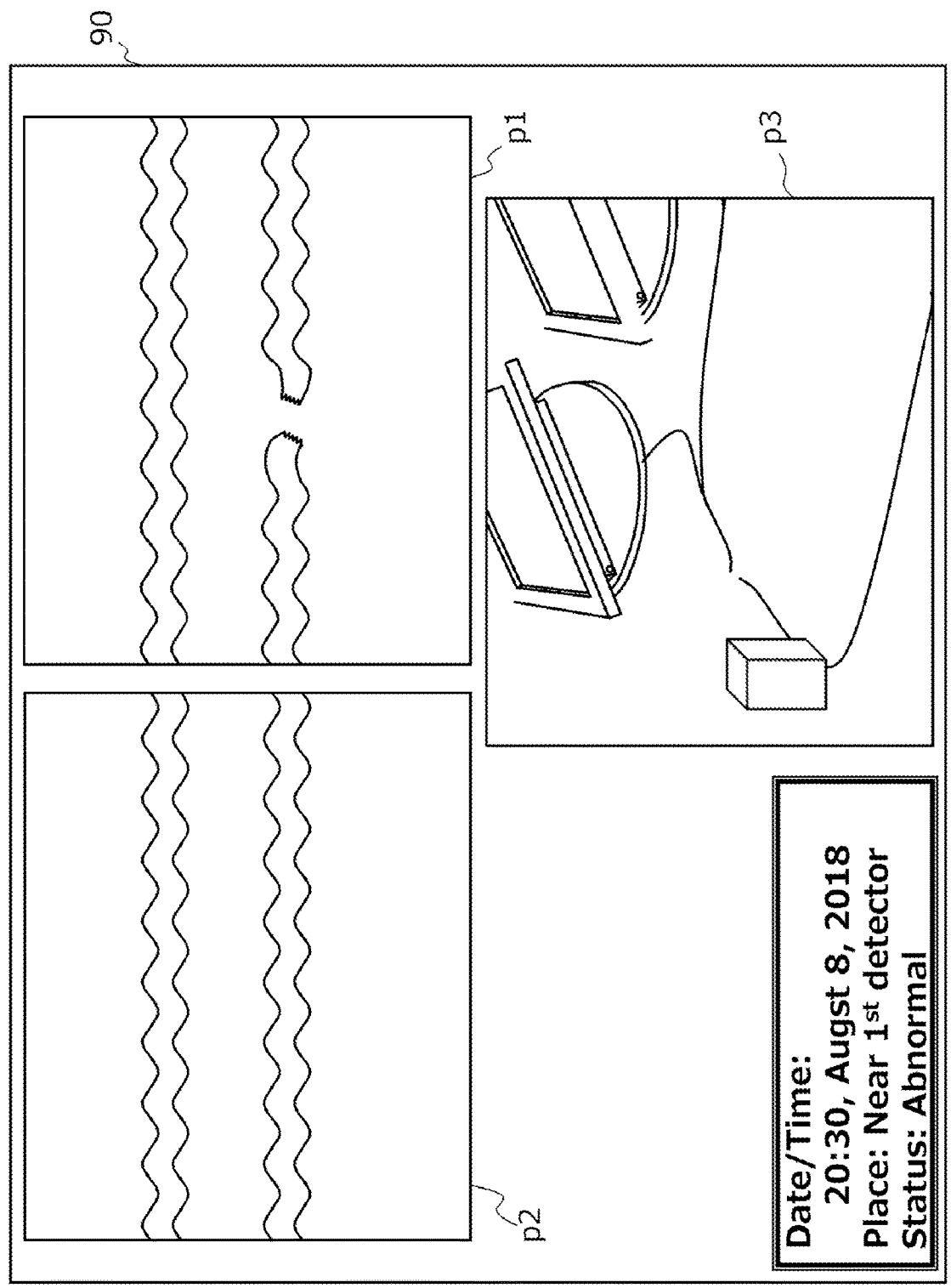
FIG. 5 is an example of a screen displayed on the information output device at the time of abnormality.

When an abnormality occurs, the information output device 90 displays the first image p1, the second image p2, and the third image p3 received from the communication device 79 (refer to FIG. 5).

At this time, the information output device 90 displays information regarding the first image p1, the second image p2, the third image p3, the date and time (photographing date and time) corresponding to the first image p1, the photographing place, and the presence or absence of an abnormality (status).

Note that it is desirable that the information regarding the presence/absence of abnormality is displayed in a more emphasized state than in the normal state.

FIG. 5 shows an example that, as the first image p1, an image of a state where the first cable c1 at the photographing place is disconnected is displayed, as the second image p2, an image of a state where neither the first cable c1 nor the second cable c2 taken about one day ago at said photographing place is disconnected is displayed, as the third image p3, an image around said photographing place (an area including the power generator 10 and the first detector 61) is displayed, and as information about the photographing date and time, a state where the photographing date and time is 20:30 on Aug. 8, 2018, the photographing place is near the first detector 61, and the status is abnormal is displayed.

During the time period (second time period) when the power generator 10 does not generate power, such as at night, normally, no current flows through the first cable c1 and the second cable c2. However, in the first embodiment, since a weak current flows from the power storage unit 30 via the first circuit unit 50, even during such said time period, it becomes possible to detect an abnormality based on a change in a current value or the like.

That is, it becomes possible to identify the occurrence of an abnormality and the location where the abnormality has occurred at an early stage, even if disconnection of the cable occurs when a power generator 10 does not generate power (when normal power supply is not performed by the power generator 10).

When at least a part of the power generator 10 and the cables (the first cable c1 and the second cable c2) are stolen, a disconnection is likely to occur somewhere between the power generator 10 and the charge controller 20.

When the disconnection occurs, the current flowing through the first cable c1 and the second cable c2 and the voltage applied to the power generator 10 or the charge controller 20 come to zero.

In addition, there is a high possibility that the current and voltage come to zero at the location near the location where the disconnection has occurred.

For example, if the disconnection occurs between the power generator 10 and the first detector 61, the possibility that the first detector 61 detects the abnormality earlier than the second detector 62 to the fourth detector 64 is high.

In the first embodiment, the detectors 60 (first detector 61 to fourth detector 64) provided at a plurality of locations can detect an abnormality when a current (or voltage) decreases.

In addition, by moving the moving device 70 to the vicinity of the detector that has detected the abnormality first, photographing said vicinity, and comparing the current image (first image p1) with the past image (second image p2), it becomes possible to identify the abnormality occurrence location at an early stage.

In addition, by capturing an image (third image p3) around the abnormality occurrence location, the possibility of obtaining information regarding the cause of disconnection (people, animals, objects, etc.) increases.

Further, since a weak current is passed to the power generator 10 and the like by using the electric power accumulated in the power storage unit 30, abnormality can be detected without receiving power supply from the outside.

Figure 6:
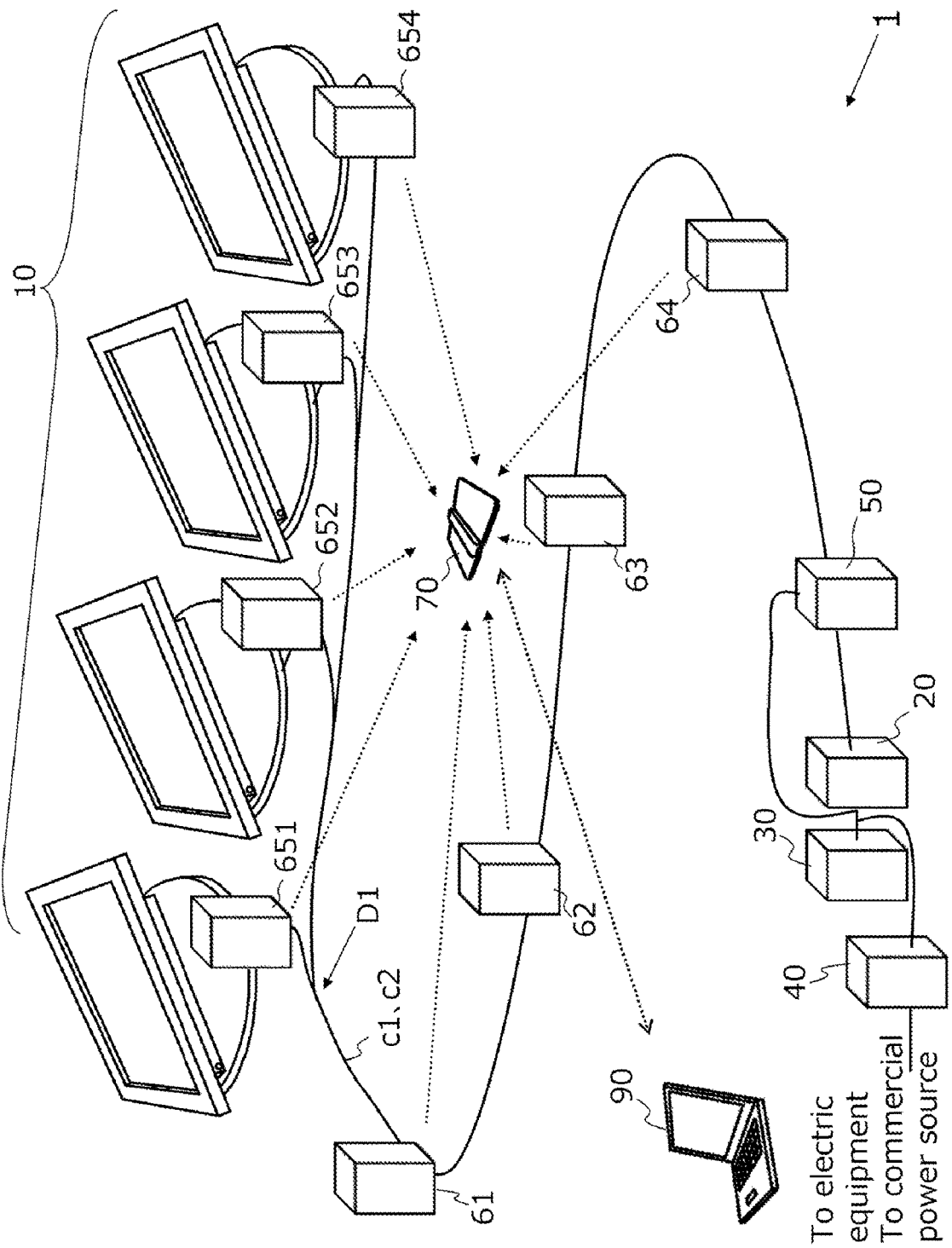
FIG. 6 is a perspective view illustrating a configuration of the detection system according to the first embodiment, in which detectors are also provided near each solar panel.

Note that when the power generator 10 is composed of a plurality of solar panels, and the first cable c1 and the second cable c2 are branched and connected to the respective solar panels, the detector 60 may be provided between said branched region and each solar panel (refer to FIG. 6).

FIG. 6 describes an example that four detectors (51st detector 651 to 54th detector 654) are provided between the area D1 where the first cable c1 and the second cable c2 branch and the four solar panels, and each of the detectors 60 (first detector 61 to fourth detector 64, 51st detector 651 to 54th detector 654) has a power generation device.

Figure 7:
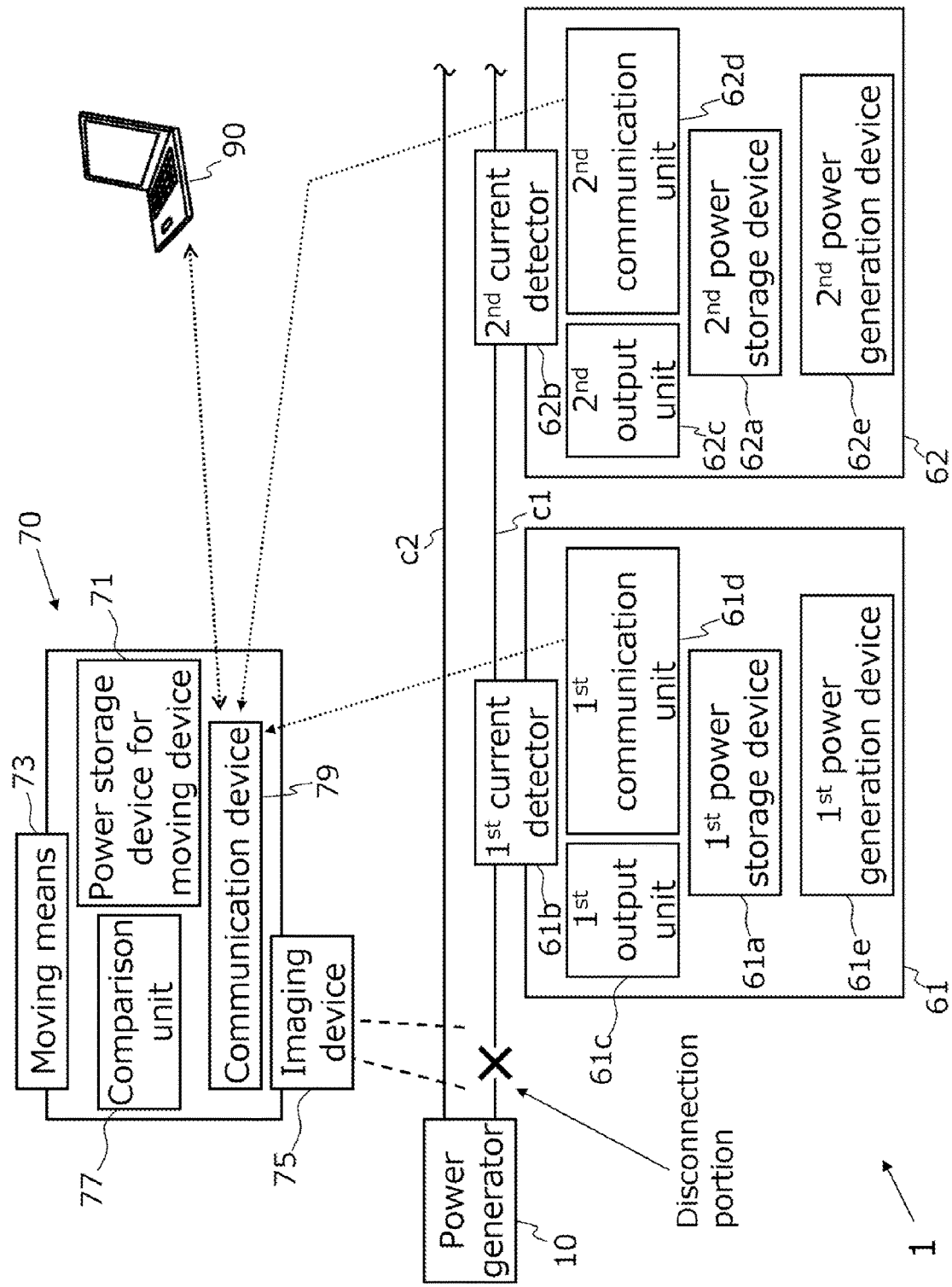
FIG. 7 is a schematic diagram illustrating a configuration of a region including a first detector of the detection system according to the first embodiment, the power generation device is provided in each of the detectors.

Further, although each of the detectors has been described as being driven based on the electric power supplied from the power source installed at a position distant from the detector such as the power storage unit 30, but each of the detectors may have a power generation device such as a solar panel and be driven without being supplied with power from the power storage unit 30 or the like (refer to FIG. 7).

FIG. 7 shows an example in which the first detector 61 has a first power generation device 61*e*, and the second detector 62 has a second power generation device 62*e*.

In this case, the detectors can be driven independently without receiving power from the outside, and a change in a current value or the like can be notified to the moving device 70.

In the first embodiment, an example in which the detection system 1 is used for the solar power generation device including the power generator 10, the power storage unit 30 (or the inverter 40), and the cable (the first cable c1 or the like) has been described, but the device using the detection system 1 is not limited to the solar power generation device.

For example, the detection system 1 may be used for a system including a test target power source 300 such as a generator, a load test device 100 for performing a load test of the test target power source 300, and a cable connecting the test target power source 300 and the load test device 100 (first cable c1 and second cable c2) (second embodiment, refer to FIG. 8).

In the second embodiment, the load test device 100 corresponds to the first device in the claims, the test target power source 300 corresponds to the second device in the claims, and the power supply for the load test from the test target power source 300 to the load test device 100 corresponds to the second power supply in the claims.

During the load test, power is supplied from the test target power source 300 to the load test device 100.

When the load test is not performed (when no second power supply is provided), power is supplied to the load test device 100 so as to allow a weak current to flow from the commercial power source to the first cable c1 etc. via the second circuit unit 500.

The second circuit unit 500 controls the electric power supplied from the commercial power source to the load test device 100 via the electric circuit of the second circuit unit 500, such that a weak current, in which electric power per unit time required to supply from the commercial power source to the load test device 100 via the electric circuit of the second circuit unit 500 is $1/100$ or less of electric power per unit time supplied from the test target power source 300 to the load test device 100 during the load test, flows to the first cable c1 and the like.

In each of the detectors 60, when a weak current does not flow by the predetermined amount and the current value detected is equal to or less than the current threshold value, it is determined that there is an abnormality, and any of voice, light, and image is output as the output of information regarding the abnormality.

In addition, in each of the detectors 60, when a weak current does not flow by the predetermined amount and the current value detected is equal to or less than the current threshold value, information regarding a fact that the current value detected is equal to or less than the current threshold value is transmitted to the moving device 70 as the transmission of information relating to the abnormality.

Note that when the power supplied to the load test device 100 is alternating current, the detected current value is not an instantaneous value, but a maximum value, an average value, or an effective value is used.

This makes it possible to identify the occurrence of an abnormality and the location where the abnormality has occurred at an early stage, even if disconnection of the cable occurs when a load test is not performed (when normal power supply to a load test device 100 is not performed).

In the first embodiment, the form has been described in which a weak current is passed during a time period (second time period) in which power generation by the power generator 10 is not performed, such as at night, to detect an abnormality in the cable or the like.

In the second embodiment, the form has been described in which a weak current is passed to detect an abnormality in the cable or the like when the load test is not performed.

However, the form in which the occurrence of an abnormality and the occurrence place of the abnormality are specified by using a plurality of the detectors 60 may be performed during a load test or during the time when power is generated by the power generator 10, such as during the daytime.

In this case, it is conceivable that the current flowing through the cable fluctuates greatly due to the amount of the irradiation of the sun or the power supplied from the test target power source, and also the current that flows instantaneously becomes zero.

Therefore, it is desirable to determine whether or not there is an abnormality by measuring not only the instantaneous current value or voltage value, but also the time-series current waveform or voltage waveform and comparing the waveform pattern at the time of normal and the waveform pattern at the time of abnormality with the measured waveform.

Further, in order to avoid a malfunction, when one of the detectors 60 detects that the current value (or voltage value)

decreases, the switch 50b may be controlled by temporarily switching from the first state to the second state to supply power from the power storage unit 30 to the power generator 10 via the electric circuit 50a.

In this case, in the current detection (or voltage detection) by the detector 60, if the current value (or voltage value) is in a low state, it is determined that an abnormality has occurred, otherwise, assuming that the current drop and the voltage drop are temporary, switch control for switching from the second state to the first state is performed (refer to the flowchart in FIG. 9).

Specifically, the communication units of each of the detectors 60 (first communication unit 61d to fourth communication unit 64d) transmits information about an instruction to switch from the first state to the second state and an instruction to switch from the second state to the first state to the first circuit unit 50 (or the second circuit unit 500) before transmitting information to the moving device 70.

For example, in the first communication unit 61d, when a weak current does not flow by the predetermined amount and the current value detected by the first current detector 61b is equal to or less than the current threshold value, the first communication unit 61d transmits information regarding an instruction to perform switch control for switching from the first state to the second state to the first circuit unit 50 (or the second circuit unit 500) (refer to steps S11 and S12 in FIG. 9).

As a result, the first state is switched to the second state.

That is, in the first embodiment, the state where the power storage unit 30 is charged from the power generator 10 via the charge controller 20 (first state) is switched to the state where a weak current is passed from the power storage unit 30 to the power generator 10 via the electric circuit 50a (second state).

Further, in the second embodiment, the state where power is supplied from the test target power source 300 to the load test device 100 (first state) is switched to the state where a weak current is passed through the load test device 100 from a commercial power source via the electric circuit of the second circuit unit 500 (second state).

After switching, in the first communication unit 61d, when a weak current does not flow by the predetermined amount and the current value detected by the first current detector 61b is equal to or less than the current threshold value, information regarding a fact that the current value detected by the first current detector 61b is equal to or less than the current threshold value is transmitted to the moving device 70 as the transmission of information relating to the abnormality to the first circuit unit 50 (or to the second circuit unit 500) (refer to steps S13 and S14 in FIG. 9).

After the switching, in the first communication unit 61d, when a weak current flows by the predetermined amount and the current value detected by the first current detector 61b is not equal to or less than the current threshold value, the first communication unit 61d transmits information regarding an instruction to perform switch control for switching from the second state to the first state to the first circuit unit 50 (or the second circuit unit 500) (refer to steps S13 and S15 in FIG. 9).

In this case, the decrease in a current value detected in step S11 is considered to be temporary, and the state is returned to the original first state.

Under a situation where either the first power supply (power supply from the power generator 10 to the power storage unit 30) or the second power supply (power supply from the test target power source 300 to the load test device 100) is provided, when the current passed to the first device (power generator 10 or load test device 100) does not flow by the predetermined amount, a weak current is applied to the first device. In such a situation, when it becomes in a state in which said weak current does not flow by the predetermined amount, the detector 60 transmits information to the moving device 70.

As a result, accurate abnormality detection can be performed without determining the temporary decrease in a current value (or voltage drop) during normal operation as abnormal.

Although some embodiments of the present invention have been described, these embodiments are presented as examples and are not intended to limit the scope of the invention. These embodiments can be implemented in various other forms, and various omissions, replacements, and changes can be made without departing from the spirit of the invention. These embodiments and modifications thereof are included in the invention described in the claims and equivalents thereof as well as included in the scope and the gist of the invention.

REFERENCE SIGNS LIST 1 detection system
10 power generator
20 charge controller
30 power storage unit
40 inverter
50 first circuit unit
50a electric circuit
50b switch
60 detector
61 to 64 first detector to fourth detector
61a to 64a first power storage device to fourth power storage device
61b to 64b first current detector to fourth current detector
61c to 64c first output unit to fourth output unit
61d to 64d first communication unit to fourth communication unit
651 to 654 51st detector to 54th detector
70 moving device
71 power storage device for moving device
73 moving means
75 imaging device
77 comparison unit
79 communication device
90 information output device
100 load test device
300 test target power source
500 second circuit unit
c1, c2 first cable, second cable
p1, p2, p3 first screen, second screen, third screen

The invention claimed is:

1. A detection system, comprising:
a first device;
a second device configured to receive first power supply from the first device or provide second power supply to the first device, via a cable; and
a plurality of detectors, each of which has an electricity detector and at least one of an output unit and a communication unit, at least one of the output unit and the communication unit performing at least one of outputting information and transmitting the information, when it becomes in a state in which weak current does not flow by a predetermined amount based on a detected information from the electricity detector, in a period in which the weak current is passed to the first device via at least a part of the cable, under a situation where the first power supply and the second power supply are not provided, the detection system further comprising:

a moving device configured to move between the first device and the second device to photograph at least one of the first device, the second device, and the cable, and a display configured to display image data obtained by the photographing from the moving device, wherein the plurality of the detectors is provided between the first device and the second device, and when the information is transmitted, the display displays a first image obtained by the photographing in a vicinity of the detector that has transmitted the information first among the plurality of detectors, a second image of past of a same place where the photographing has been performed, and information regarding a comparison result of the first image and the second image, or the display displays the first image and a third image obtained by photographing at a wider angle of view than the first image.

2. A detection system, comprising:

a first device;

a second device configured to receive first power supply from the first device or provide second power supply to the first device, via a cable; and a plurality of detectors, each of which has an electricity detector and at least one of an output unit and a communication unit, at least one of the output unit and the communication unit performing at least one of outputting information and transmitting the information, when it becomes in a state in which weak current does not flow by a predetermined amount based on a detected information from the electricity detector, in a period in which the weak current is passed to the first device via at least a part of the cable, under a situation where the first power supply and the second power supply are not provided, the detection system further comprising:

a moving device configured to move between the first device and the second device to photograph at least one of the first device, the second device, and the cable, wherein the plurality of the detectors is provided between the first device and the second device, the first device is a power generator including a solar panel, and the second device is at least one of a power storage unit configured to store electric power obtained by the power generator and an inverter configured to convert the electric power obtained by the power generator into an alternating current, and the second device receives the first power supply.

3. The detection system according to claim 2, wherein weak electric power supplied to the first device is supplied from the second device via a first circuit unit when the first device does not generate power, and the first circuit unit controls electric power supplied from the second device to the first device via the first circuit unit such that the weak current flows to the cable, the weak current keeping that electric power per unit time required to supply from the second device to the first device via the first circuit unit is $1/100$ or less of electric power per unit time that can be generated by the first device.

4. The detection system according to claim 1, wherein the first device is a load test device, the second device is a test target power source corresponding to the load test device, for performing the second power supply, the weak electric power supplied to the first device is supplied from a commercial power source via a second circuit unit when a load test of the test target power source is not performed, and the second circuit unit controls electric power supplied from the commercial power source to the first device via the second circuit unit, such that the weak current flows to the cable, the weak current keeping that electric power per unit time required to supply from the commercial power source to the first device via the second circuit unit is $1/100$ or less of electric power per unit time supplied from the second device to the first device during a load test.

5. The detection system according to claim 2, further comprising a display configured to display image data obtained by the photographing from the moving device, wherein, when the information is transmitted, the display displays a first image obtained by the photographing in a vicinity of the detector that has transmitted the information first among the plurality of detectors, a second image of past of a same place where the photographing has been performed, and information regarding a comparison result of the first image and the second image.

6. The detection system according to claim 2, further comprising a display configured to display image data obtained by the photographing from the moving device, wherein, when the information is transmitted, the display displays a first image obtained by the photographing in a vicinity of the detector that has transmitted the information first among the plurality of detectors, and a third image obtained by photographing at a wider angle of view than the first image.

7. The detection system according to claim 1, wherein a weak current is passed to the first device when one of the plurality of detectors detects that a current value or a voltage value has decreased, under a situation in which either the first power supply or the second power supply is provided.

8. A detection system, comprising:

a first device;

a second device configured to receive first power supply from the first device or provide second power supply to the first device, via a cable;

a plurality of detectors, each of which is has an electricity detector and at least one of an output unit and a communication unit, at least one of the output unit and the communication unit performing at least one of outputting information and transmitting the information when it becomes in a state in which a current is not passed to the first device by a predetermined amount based on a detected information from the electricity detector;

a moving device configured to move between the first device and the second device along an area where the cable is located and to photograph at least one of the first device, the second device, and the cable, and a display configured to display image data obtained by the photographing from the moving device, wherein the plurality of the detectors is provided between the first device and the second device, when the information is transmitted, the display displays a first image obtained by the photographing in a vicinity of the detector that has transmitted the information first among the plurality of detectors, a second image of past of a same place where the photographing has been performed, and information regarding a comparison result of the first image and the second image, or the display displays the first image and a third image obtained by photographing at a wider angle of view than the first image.

\* \* \* \* \*